United States Patent
Seo et al.

(10) Patent No.: US 10,832,941 B2
(45) Date of Patent: Nov. 10, 2020

(54) AIRGAP ISOLATION FOR BACKEND EMBEDDED MEMORY STACK PILLAR ARRAYS

(71) Applicant: International Business Machines Corporation, Armonk, NY (US)

(72) Inventors: Soon-Cheon Seo, Glenmont, NY (US); Injo Ok, Loudonville, NY (US); Alexander Reznicek, Troy, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/365,927

(22) Filed: Mar. 27, 2019

(65) Prior Publication Data

US 2020/0312704 A1  Oct. 1, 2020

(51) Int. Cl.
| H01L 21/764 | (2006.01) |
| H01L 27/22 | (2006.01) |
| H01L 43/02 | (2006.01) |
| H01L 45/00 | (2006.01) |
| H01L 27/24 | (2006.01) |
| H01L 43/12 | (2006.01) |

(52) U.S. Cl.
CPC .......... *H01L 21/764* (2013.01); *H01L 27/222* (2013.01); *H01L 27/2463* (2013.01); *H01L 43/02* (2013.01); *H01L 43/12* (2013.01); *H01L 45/1233* (2013.01); *H01L 45/1293* (2013.01); *H01L 45/16* (2013.01)

(58) Field of Classification Search
CPC ... H01L 21/764; H01L 45/1233; H01L 45/16; H01L 43/12; H01L 27/222; H01L 43/02; H01L 45/1293; H01L 27/2463
See application file for complete search history.

(56) References Cited

U.S. PATENT DOCUMENTS

| 8,106,376 | B2 | 1/2012 | Lai |
| 8,900,988 | B2 | 12/2014 | Lin |
| 8,912,591 | B2 | 12/2014 | Baek |
| 9,252,188 | B2 | 2/2016 | Tang |
| 9,401,371 | B1 | 7/2016 | Lee |
| 9,773,695 | B2 | 9/2017 | Purayath |
| 9,911,790 | B1 | 3/2018 | Shimabukuro |
| 2014/0191401 | A1* | 7/2014 | Fischer ............ H01L 21/76852 257/751 |
| 2017/0358628 | A1* | 12/2017 | Fantini .................. H01L 45/06 |

(Continued)

*Primary Examiner* — Yasser A Abdelaziez
(74) *Attorney, Agent, or Firm* — Michael A. Petrocelli

(57) ABSTRACT

A method of forming a memory structure includes forming an opening on opposing sides of a plurality of memory pillars disposed on a substrate, the opening extends through a capping layer located above a first dielectric layer and a top portion of an oxide layer, the oxide layer is located between the first dielectric layer and an encapsulation layer on the substrate, the encapsulation layer surrounds the plurality of pillars, removing the oxide layer from areas of the memory structure located between the memory pillars, above the encapsulation layer and below the first dielectric layer, after removing the oxide layer a gap remains within the areas of the memory structure, and forming a second dielectric directly above the capping layer, wherein the second dielectric layer pinches off the opening to form airgaps.

14 Claims, 5 Drawing Sheets

(56) References Cited

U.S. PATENT DOCUMENTS

2018/0197915 A1     7/2018   Briggs
2019/0259772 A1*   8/2019   Takahashi ........... H01L 45/1675
2020/0161250 A1*   5/2020   Seo ....................... H01L 23/528

* cited by examiner

AIRGAP ISOLATION FOR BACKEND EMBEDDED MEMORY STACK PILLAR ARRAYS

BACKGROUND

The present invention generally relates to the field of semiconductor devices, and more particularly to isolation of backend embedded memory stack pillars using airgaps.

A memory device is a type of integrated circuitry used in computer systems for storing data. SRAM (static random access memory), DRAM (dynamic random access memory), and FLASH are the mainstream memory technologies based on the charge storage mechanism. Examples of emerging non-volatile memory (NVM) devices include resistive random access memory (RRAM), ferroelectric random access memory (FRAM), magneto-resistive random access memory (MRAM), and phase-change random access memory (PRAM), also called phase change memory (PCM), among other devices. These NVM devices can be manufactured in BEOL (back-end-of-the-line) where ground rule is relaxed and leave FEOL (front-end-of-the-line) process relatively simpler.

SUMMARY

According to an embodiment of the present disclosure, a method of forming a memory structure includes forming an opening on opposing sides of a plurality of memory pillars disposed on a substrate, the opening extends through a capping layer located above a first dielectric layer and a top portion of an oxide layer, the oxide layer is located between the first dielectric layer and an encapsulation layer on the substrate, the encapsulation layer surrounds the plurality of pillars, removing the oxide layer from areas of the memory structure located between the memory pillars, above the encapsulation layer and below the first dielectric layer, after removing the oxide layer a gap remains within the areas of the memory structure, and forming a second dielectric directly above the capping layer, wherein the second dielectric layer pinches off the opening to form airgaps.

According to another embodiment of the present disclosure, a method of forming a memory structure includes forming an encapsulation layer above and in direct contact with a plurality of memory pillars disposed on a substrate, forming an oxide layer directly above the encapsulation layer, removing portions of the encapsulation layer located above a top surface of each memory pillar in the plurality of memory pillars, recessing the oxide layer to expose an uppermost portion of each memory pillar in the plurality of memory pillars, depositing a first dielectric layer directly above the oxide layer, and in direct contact with the encapsulation layer and the exposed uppermost portion of each memory pillar in the plurality of memory pillars, forming top metal contacts on the exposed uppermost portion of each memory pillar in the plurality of memory pillars, depositing a capping layer directly above the first dielectric layer and the top metal contacts, forming an opening on opposing sides of the plurality of memory pillars, the opening extends through the capping layer, the first dielectric layer and a top portion of the oxide layer, removing the oxide layer from areas of the memory structure located between the memory pillars, above the encapsulation layer and below the first dielectric layer, after removing the oxide layer a gap remains within the areas of the memory structure; and forming a second dielectric above the capping layer, wherein the second dielectric layer pinches off the opening to form airgaps.

According to yet another embodiment of the present disclosure, a memory structure includes a plurality of memory pillars disposed on a substrate, an encapsulation layer in direct contact with the substrate and the plurality of memory pillars, top metal contacts on a first dielectric layer, the top metal contacts positioned directly above a top surface of the plurality of memory pillars, a capping layer directly above the first dielectric layer, an opening located on opposite sides of the plurality of memory pillars, an airgap located above the encapsulation layer between the memory pillars and below the first dielectric layer; and a second dielectric layer located above the capping layer, wherein the second dielectric layer pinches off the opening.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
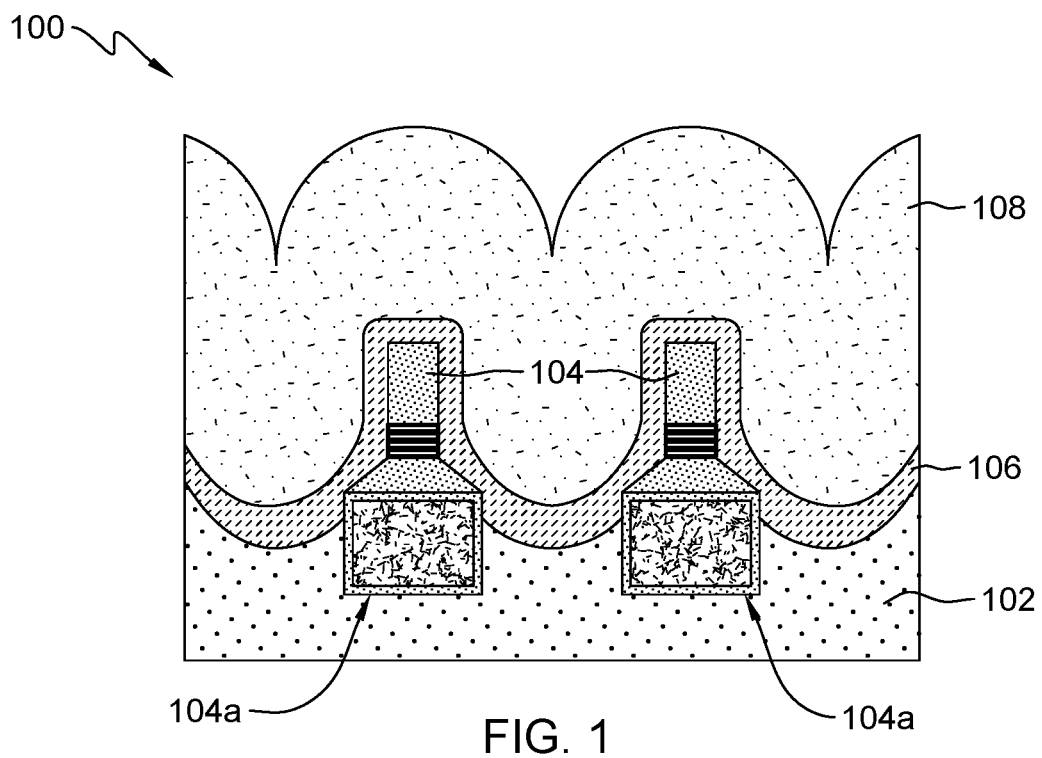
FIG. 1 depicts forming an encapsulation layer and an oxide layer on a memory structure including a plurality of memory pillars during a back-end-of-the-line (BEOL) integration process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As integrated circuit fabrication continues to strive to produce smaller and denser integrated circuits, the reduction in size and increased aspect ratio of vertically stacked memory cells make the isolation of memory devices a challenging task. Failure to properly isolate the vertically stacked memory cells, also referred to as memory stack pillar arrays, or simply memory pillars, leads to parasitic capacitance interference as well as thermal interaction between the memory pillars. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components.

Charge-based memories face challenges on scaling below the 10 nm node, mainly due to the easy loss of stored charge. This results in degraded performance, reliability, and noise margin. Thus, there is an increasing demand in research and development for non-charge based non-volatile memory (NVM) technologies in the semiconductor industry. As mentioned above, emerging NVM devices can be manufactured in BEOL where ground rule is relaxed which, in consequence, make FEOL processes relatively simpler. However, it is important to maintain BEOL low RC delay requirements. Airgap isolation can be applied to NVM devices to isolate memory pillars while satisfying low RC delay requirements during BEOL processes.

Therefore, embodiments of the present disclosure provide a method of isolating memory pillars using airgaps in order to substantially reduce parasitic capacitance between memory pillars, enhance thermal isolation, and improve overall read characteristics of non-volatile memory devices.

Embodiments of the present invention generally relate to the field of semiconductor devices, and more particularly to isolation of backend embedded memory stack pillars using airgaps. One way to form airgaps between memory pillars includes forming an encapsulation layer on the memory pillars followed by an oxide layer, forming openings on a low-k interlevel dielectric deposited after contact patterning and metallization is finished, selectively removing the oxide layer from areas of the memory device located between the memory pillars, and lateral areas below the low-k dielectric and above the encapsulation layer through the openings, and pinching-off the openings after removing the oxide layer to form the airgaps. One embodiment by which the airgaps can be formed is described in detailed below by referring to the accompanying drawings in FIGS. 1-9.

Referring now to FIG. 1, a memory structure 100 at an intermediate step during a back-end-of-the-line (BEOL) integration process is shown, according to an embodiment of the present disclosure. In this embodiment, the memory structure 100 may be, for example, a MRAM device. In other embodiments, the memory structure 100 may be a RRAM device, PCM device or any other BEOL memory device.

The memory structure 100 includes a plurality of memory pillars 104 (hereinafter "memory pillars"). Each memory pillar 104 includes a bottom electrode 104a. It should be noted that some elements and/or features of the memory pillars 104 and bottom electrode 104a are illustrated in the figures but not described in detail in order to avoid unnecessarily obscuring the presented embodiments. Those skilled in the art may understand that the memory devices embodied by the memory pillars 104 are well known, and therefore are explained at a general level.

The memory pillars 104, and respective bottom electrode 104a, are disposed on a substrate 102. For illustration purposes only, without intent of limitation, two memory pillars 104, with corresponding bottom electrodes 104a, are depicted in the memory structure 100. As may be understood by those skilled in the art, more than two memory pillars 104 can be formed in the substrate 102. Any known method may be used to form the memory pillars 104 depending on the type of memory device being manufactured.

At this step of the manufacturing process, an encapsulation layer 106 is conformally deposited above and in direct contact with the memory pillars 104, including bottom electrodes 104a, and top surfaces of the substrate 102. The encapsulation layer 106 protects the memory pillars 104 during subsequent processing steps. Specifically, the encapsulation layer 106 prevents potential damage to the memory pillars 104 caused during formation of the airgaps 902 (FIG. 9), as will be described in detail below.

In some embodiments, the encapsulation layer 106 is formed from a material having a dielectric constant (k) lower than that of silicon nitride (SiN), and being resistant to hydrofluoric acid (HF). Non-limiting examples of materials suitable to form the encapsulation layer 106 include: siliconborocarbonitride (SiBCN), silicon carbon nitride (SiCN), or silicon oxycarbonitride (SiOCN). Any known deposition method can be used to form the encapsulation layer 106. In one embodiment, for example, atomic layer deposition (ALD) or chemical vapor deposition (CVD) can be used to form the encapsulation layer 106.

Figure 9:
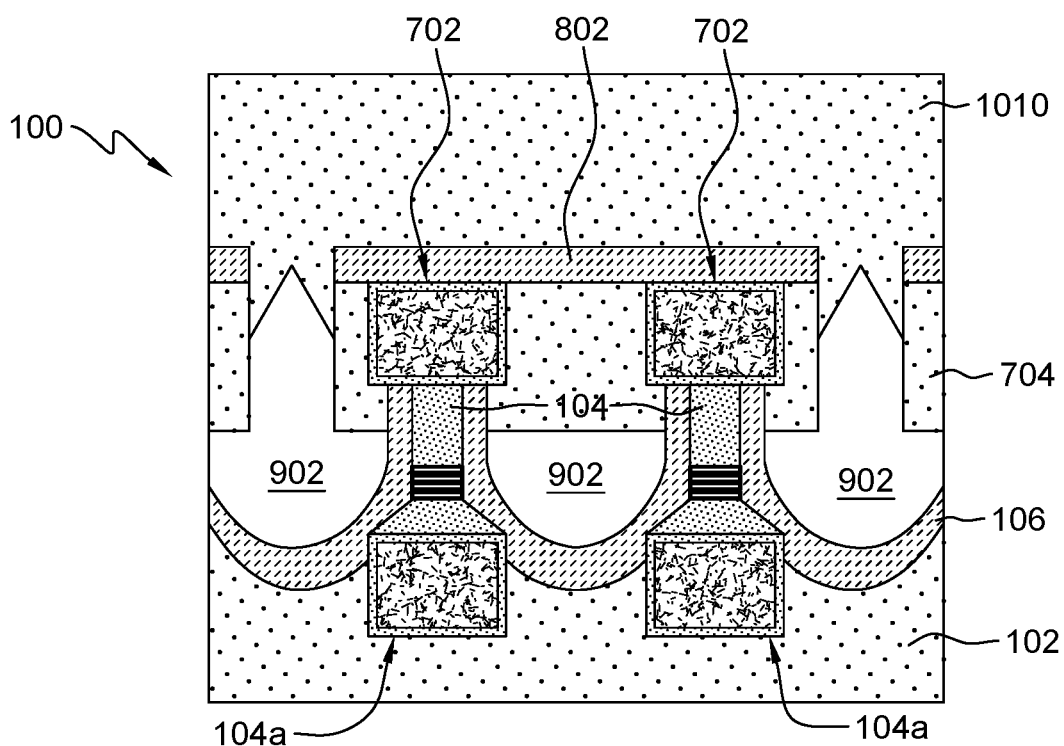
FIG. 9 depicts forming airgaps in the memory structure, according to an embodiment of the present disclosure.

According to an embodiment, the encapsulation layer 106 may have a thickness varying from approximately 3 nm to approximately 50 nm. In some embodiments, the thickness of the encapsulation layer 106 can be adjusted according to a desired size of the airgaps 902 (FIG. 9). Stated differently, by modulating a thickness of the encapsulation layer 106, a size of the subsequently formed airgaps 902 (FIG. 9) can be controlled.

An oxide layer 108 is subsequently formed on the memory structure 100. In some embodiments, the oxide layer 108 is deposited above and in direct contact with the encapsulation layer 106. The oxide layer 108 generally includes silicon dioxide ($SiO_2$). Any known deposition method may be performed to form the oxide layer 108. For example, the oxide layer 108 may be deposited by using a plasma-enhanced chemical vapor deposition (PECVD) method.

Alternatively, in some embodiments, a flowable oxide (FOX) or spin-on material can be used to form the oxide layer 108. A flowable oxide is a flowable, inorganic polymer obtained by chemical deposition that provides an alternative material to silicon dioxide having improved gap filling capabilities.

In some embodiments, owing to the high aspect ratio of the memory pillars 104, voids can form within the oxide layer 108 during the formation or deposition process. In such embodiments, voids are filled prior to continuing with the manufacturing process, as will be described in FIGS. 2-4 below.

Figure 2:
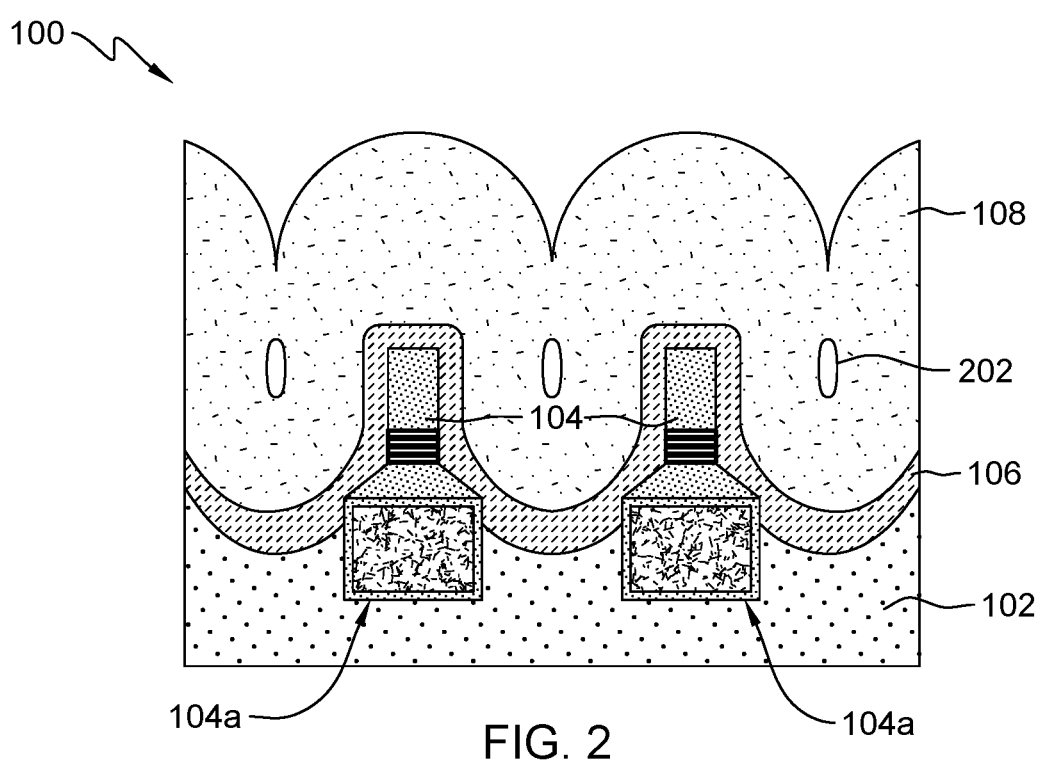
FIG. 2 depicts voids formed during deposition of the oxide layer, according to an embodiment of the present disclosure.

Referring now to FIG. 2, voids 202 formed within the oxide layer 108 during the deposition process are shown, according to an embodiment of the present disclosure. Additional processing steps may be required to fill the voids 202 in the oxide layer 108 and before continuing with the manufacturing process. Specifically, a planarization process followed by deposition of an oxide material can be conducted to fill the voids 202, as will be explained in detail below.

Figure 3:
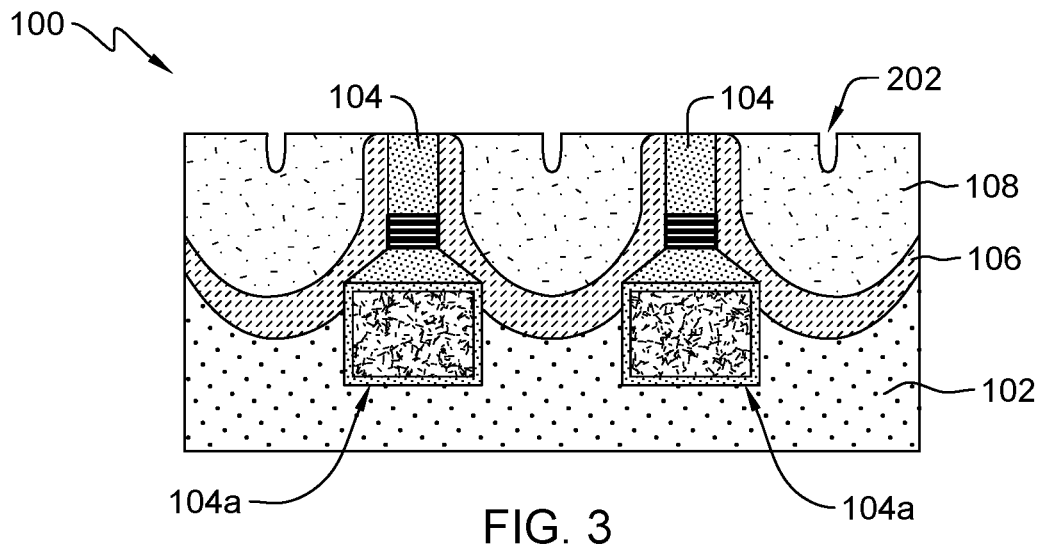
FIG. 3 depicts planarizing the oxide layer, according to an embodiment of the present disclosure.

Referring now to FIG. 3, a planarization process is used to expose the voids 202, according to an embodiment of the present disclosure. During the planarization process, sections of the encapsulation layer 106 parallel to the substrate 102, and in direct contact with a hard mask (not shown) located on a top of the memory pillars 104 are removed. Stated differently, the planarization process is performed until exposing the hard mask layer (not shown) typically disposed on top of the memory pillars 104 which acts as an etch stop.

According to an embodiment, a chemical-mechanical polishing/planarization (CMP) process may be performed to remove the encapsulation layer 106 from top surfaces of the memory pillars 104 and recess the oxide layer 108.

It should be noted that planarization of the oxide layer 108 occurs with or without the presence of voids 202. When voids are not present in the memory structure (as illustrated in FIG. 1), the process is conducted with the objective of removing the encapsulation layer 106 from top surfaces of the memory pillars 104, in preparation for (top) metal contacts formation. In embodiments in which the voids 202 are present in the memory structure 100, the planarization process has the added benefit of exposing the voids 202, as illustrated in FIG. 3. This allows filling the voids 202 with an oxide material substantially similar to the oxide material forming the oxide layer 108, as will be described in FIG. 4.

Figure 4:
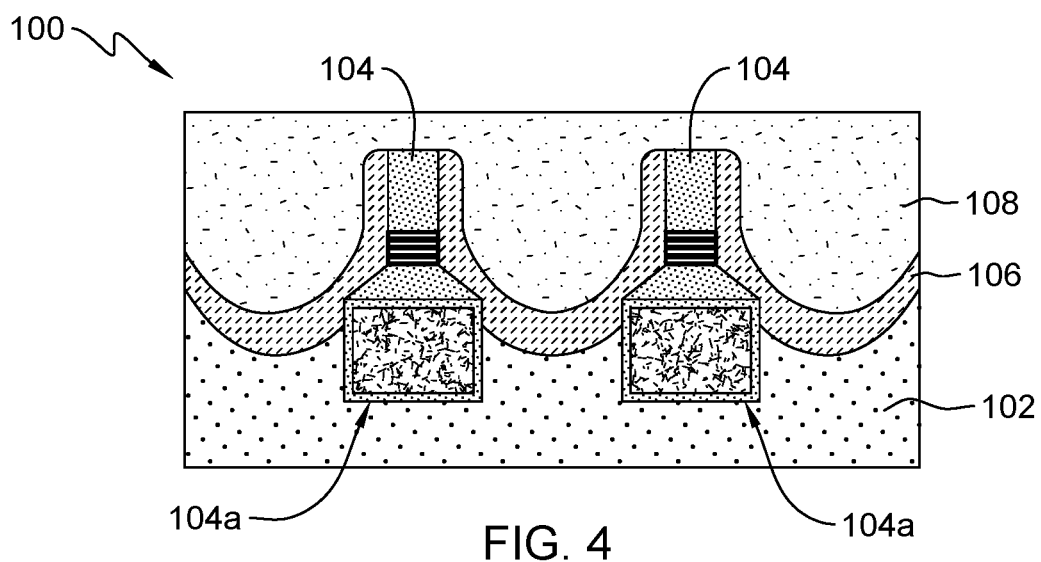
FIG. 4 depicts filling voids within the oxide layer by depositing an oxide material, according to an embodiment of the present disclosure.

Referring now to FIG. 4, voids 202 (FIG. 3) are filled with an oxide material similar to that of the oxide layer 108, according to an embodiment of the present disclosure. As shown in the figure, the voids 202 (FIG. 3) have been substantially filled by depositing the oxide material in the memory structure 100. In this embodiment, the oxide material filling the voids 202 includes silicon dioxide deposited by, for example, ALD or CVD. It should be noted that an excess of the oxide material may remain on top portions of the memory structure 100, as shown in FIG. 4.

Figure 5:
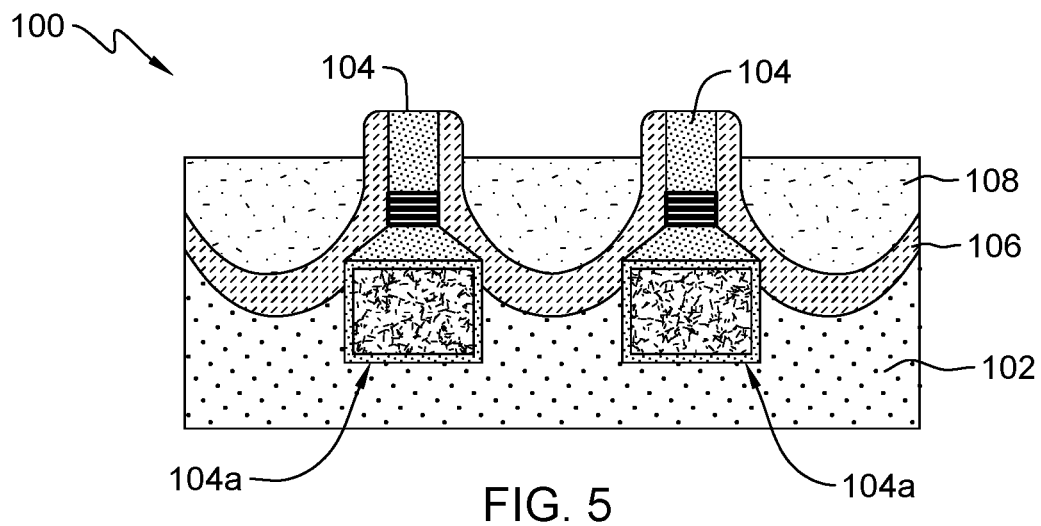
FIG. 5 depicts etching the oxide layer to expose uppermost portions of the memory pillars, according to an embodiment of the present disclosure.

Referring now to FIG. 5, an etching process is performed in the memory structure 100 to recess the oxide layer 108, according to an embodiment of the present disclosure. It should be noted that the recessing includes any oxide material that may remain on the memory structure 100 after filling the voids 202 (FIG. 3). During the etching process, the oxide layer 108 is removed until uppermost portions of the memory pillars 104 are exposed.

According to an embodiment, the performed etching technique allows selectively removing the oxide layer 108 with respect to the encapsulation layer 106. Thus, the encapsulation layer 106 remains undamaged, and protects the memory pillars 104, as shown in the figure. As mentioned above, the encapsulation layer 106 guarantees the integrity of the memory pillars 104 during processing steps, and particularly during formation of the airgaps 902 (FIG. 9). According to an embodiment, a reactive-ion etching technique may be conducted to recess the oxide layer 108. Alternatively, a wet etching process can be used to recess the oxide layer 108.

Figure 6:
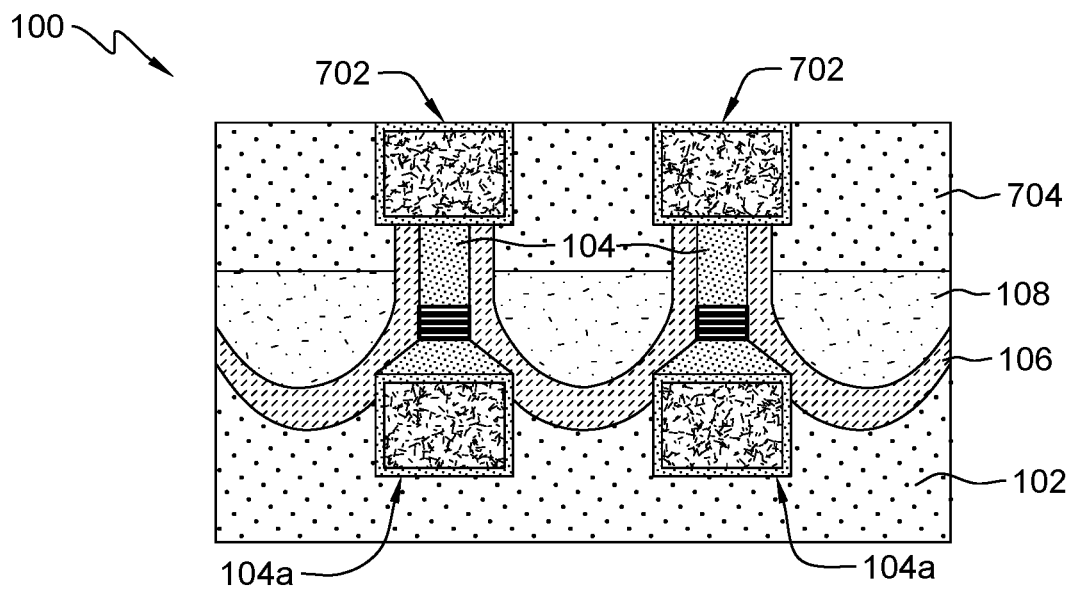
FIG. 6 depicts forming a first low-k dielectric layer and top metal contacts to the memory pillars, according to an embodiment of the present disclosure.

Referring now to FIG. 6, a first dielectric layer 704 and top metal contacts 702 are formed in the memory structure 100, according to an embodiment of the present disclosure. In an embodiment, the first dielectric layer 704 is formed above and in direct contact with the oxide layer 108. The first dielectric layer 704 may include, for example, a low-k dielectric material having a dielectric constant, k, in the range of approximately 2.0 to approximately 2.7, which may be deposited directly above the oxide layer 108 by any suitable deposition process such as, for example, CVD, PECVD, high-density CVD (HDCVD), physical-vapor deposition (PVD), sputtering, evaporation, or chemical solution deposition of the dielectric material. A thickness of the first dielectric layer 704 may vary from approximately 100 nm to approximately 500 nm and ranges there between, although a thickness less than 100 nm and greater than 500 nm may be acceptable.

Subsequently, the first dielectric layer 704 is patterned to form top metal contacts 702 to the memory pillars 104. The top metal contacts 702 allow the memory pillars 104 to be electrically connected to other devices. The process of patterning and metallization to form the top metal contacts 702 is typical and well-known in the art. The process generally involves a succession of techniques including photolithography and photomasking, wet or dry etching, and metal deposition.

It should be noted that the top metal contacts 702 are formed prior to forming airgaps 902 (FIG. 9). By doing this, accidental filling of the airgaps with metals or accidental punch trough damage during via formation can be prevented.

Figure 7:
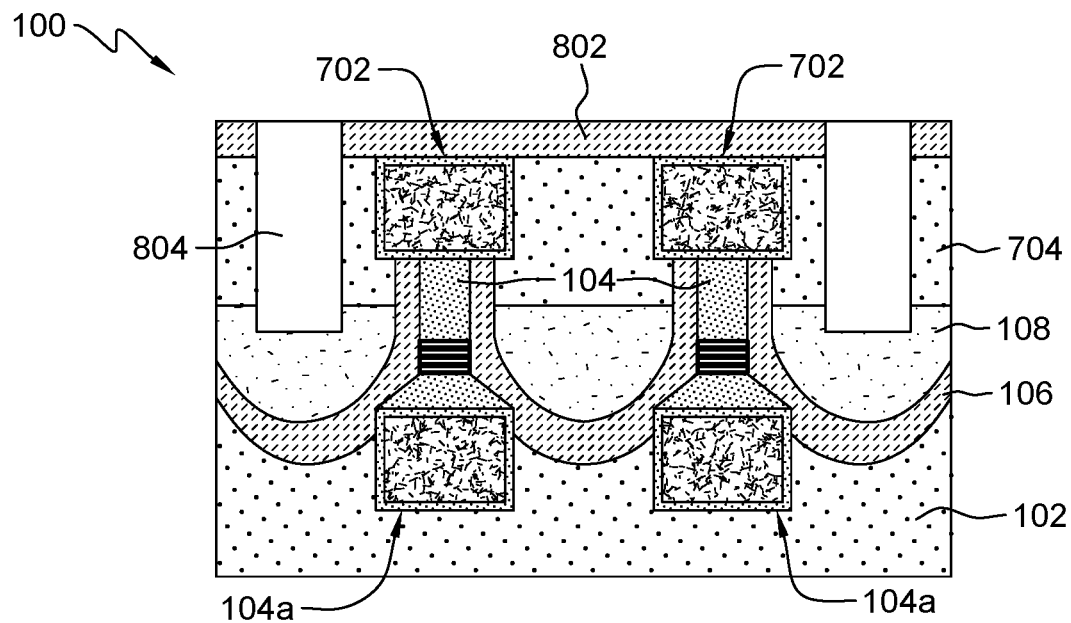
FIG. 7 depicts forming a capping layer and a plurality of openings in the first low-k dielectric layer and portions of the oxide layer, according to an embodiment of the present disclosure.
Figure 7A:
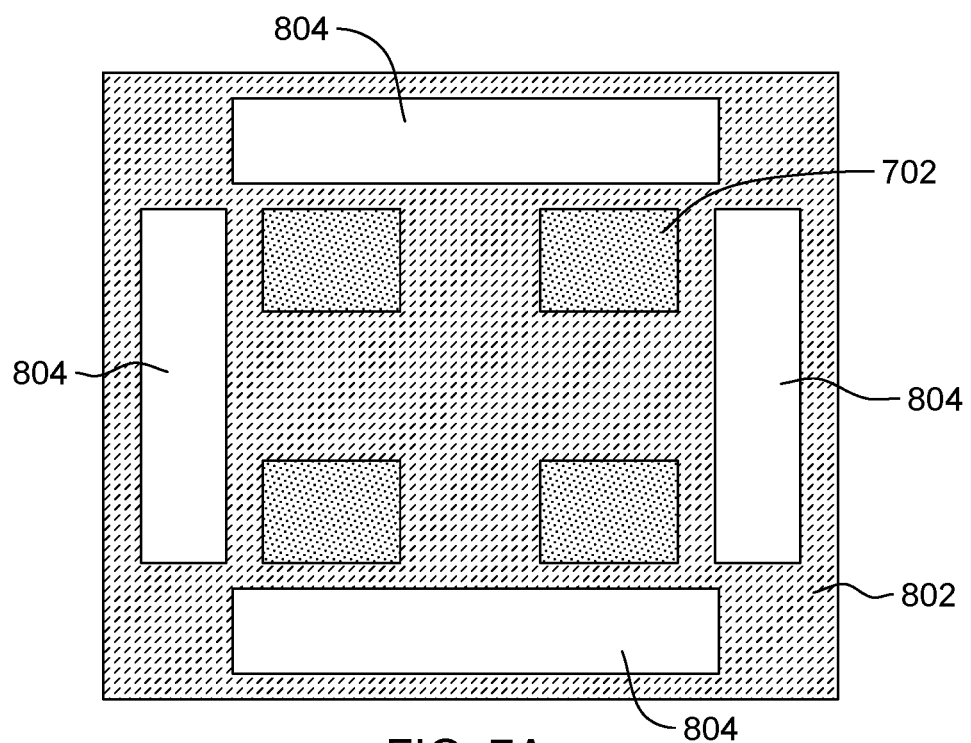
FIG. 7A is a top view of FIG. 7, according to an embodiment of the present disclosure.

Referring now to FIGS. 7-7A, a capping layer 802 is formed on the memory structure 100 prior to forming a plurality of openings 804 (hereinafter "openings"), according to an embodiment of the present disclosure. In this embodiment, FIG. 7A is a top view of the memory structure 100 of FIG. 7.

The capping layer 802 may include an insulator of silicon nitride, silicon carbide or the like which may function as both a barrier, particularly when a low-k material that may be subject to diffusion of moisture is used as interlevel dielectric, and an etch stop used when fabricating subsequent metallization level(s). According to an embodiment, the capping layer 802 may include a dielectric material such as nitrogen-doped silicon carbide (NBLoK). The capping layer 802 may be formed by any deposition method known in the art, and may typically have a thickness varying from approximately 10 nm to approximately 70 nm.

After deposition of the capping layer 802, openings 804 may be formed on opposing sides of the memory pillars 104. Specifically, in this embodiment, the openings 804 are formed on outside edges of an array of memory pillars 104, as depicted in FIG. 7A. For illustration purposes only, without intent of limitations, top contacts 702 for an array of only four memory pillars (e.g., memory pillars 104) are depicted in FIG. 7A. Those skilled in the art may know that an array of more than four memory pillars can be formed in the memory structure 100. In other embodiments, openings 804 may also be formed in areas of the memory structure 100 located between the memory pillars 104 (not shown). It should be noted that formation of openings 804 on opposing sides of the memory pillars 104, as depicted in FIGS. 7-7A, allows for a simpler device layout.

The openings 804 extend from a top surface of the capping layer 802 through a top portion of the oxide layer 108. According to an embodiment, the capping layer 108, the first dielectric layer 704 and the oxide layer 108 are etched by any method known in the art to form the openings 804. For example, a reactive ion etching (RIE) technique may be used to form the openings 804.

Preferably, the etching process used to form the openings 804 continues until a depth of approximately 5 nm to approximately 50 nm has been reached into the oxide layer 108. According to an embodiment, an overall depth or vertical length of the openings 804 may vary from approximately 50 nm and approximately 500 nm. The openings 804 may have a (horizontal) width varying from approximately 10 nm to approximately 50 nm.

According to an embodiment, the openings 804 are spaced laterally from the memory pillars 104 in a manner that prevents areas surrounding the memory pillars 104 to get damage during the RIE process. Further, in an embodiment, a size of the openings 804 depends on design ground rules. Specifically, the size of the openings 804 is selected based on a desired location of the NVM devices. In this embodiment, the openings 804 are formed in areas of the memory structure 100 where there is enough room (e.g., a fat wire level), this may facilitate future device reduction or scaling to, for example, 5 nm. However, openings 804 that are substantially large or exceed a certain size may be difficult to pinch off.

As shown in FIGS. 7-7A, the openings 804 are formed in a way such that they can, at least, make contact with the oxide layer 108. This may allow substantially removing the oxide layer 108 from the memory structure 100, as will be described in detail below.

Figure 8:
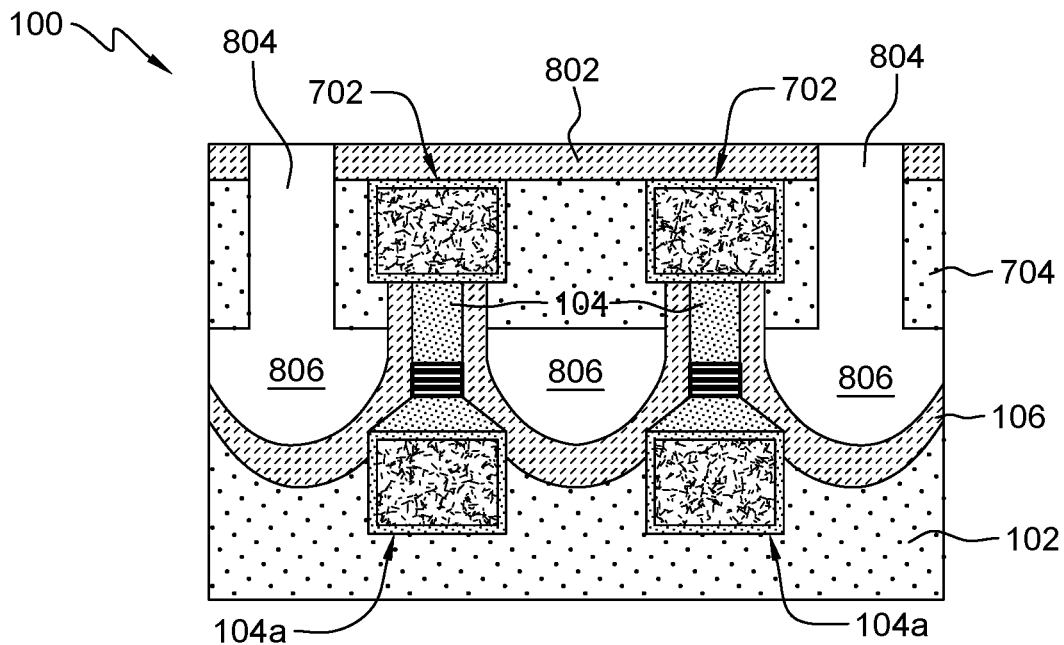
FIG. 8 depicts removing underlying oxide layer through the plurality of openings, according to an embodiment of the present disclosure.

Referring now to FIG. 8, the oxide layer 108 may be substantially removed to form gaps or pockets 806 in the memory structure 100, according to an embodiment of the present disclosure. More specifically, an etching technique is used to selectively remove the oxide layer 108 (FIG. 7) from areas of the memory structure 100 located above the encapsulation layer 106, and lateral areas between the memory pillars 104, and below the first dielectric layer 704.

Either wet or dry etching techniques can be used to remove the oxide layer 108 and create the gaps 806 between the memory pillars 104. As may be known by those skilled in the art, the selected etch chemistry can be applied to the memory structure 100 via the openings 804 to substantially remove the oxide layer 108. As can be observed in FIG. 7A, the location of the openings 804 (i.e., surrounding the array of memory pillars) allows the selected etch chemistry to penetrate the memory structure 100, and remove the oxide layer 108 from lateral areas of the memory structure 100 located between the memory pillars 104, and below the first dielectric layer 704.

It should be noted that the etching technique conducted to remove the oxide layer 108 is selective with respect to the encapsulation layer 106. Thus, the encapsulation layer 106, and hence, the memory pillars 104, remain intact during removal of the oxide layer 108.

In some embodiments, a density or number of openings 804 can be selected in order to control lateral etch. For example, forming an opening 804 every other memory pillar 104 may be enough to remove the oxide layer 108 from between two memory pillars 104, thereby avoiding etching too far. However, forming too many openings 804 may cause reliability issues (chip pull test). Therefore, openings 804 are preferably formed in areas of the memory structure 100 where there are real concerns regarding high capacitance issues.

Referring now to FIG. 9, openings 804 (FIG. 8) are pinched-off to form airgaps 902 in the memory structure 100, according to an embodiment of the present disclosure. In this embodiment, air is trapped within the gaps 806 by pinching-off the openings 804 (FIG. 8) with a dielectric material. Specifically, a second dielectric layer 1010 is deposited on the memory structure 100 to pinch-off the openings 804 (FIG. 8) and trap air within the gaps 806 (FIG. 8). Each region of trapped air defines an airgap 902 within the memory structure 100. Since air has a dielectric constant of approximately 1, the airgaps 902 may help reduce parasitic capacitance and improve thermal isolation between the memory pillars 104.

Similar to the first dielectric layer 704 (FIG. 7), the second dielectric layer 1010 may include a low-k dielectric material having a dielectric constant, k, in the range of approximately 2.0 to approximately 2.7, and may be deposited on the memory structure 100 by any known pinch-off deposition approach including, for example, plasma-enhanced CVD. A thickness of the second dielectric layer 1010 may vary from approximately 100 nm to approximately 500 nm and ranges there between, although a thickness less than 100 nm and greater than 500 nm may be acceptable.

Therefore, by forming the airgaps 902 between the memory pillars 104, parasitic resistance can be reduced, and thermal isolation enhanced between the memory pillars 104, thereby improving overall read characteristics of the memory structure 100. Additionally, by forming the encapsulation layer 106, an integrity of the memory pillars 104 can be maintained during the integration process, and a size of the airgaps 902 can be adjusted by tuning or modulating the thickness of the encapsulation layer 106 allowing to meet design and/or performance requirements.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a memory structure, the method comprising:

forming an opening on opposing sides of a plurality of memory pillars disposed on a substrate, wherein the opening extends through a capping layer located above a first dielectric layer and a top portion of an oxide layer, the oxide layer is located between the first dielectric layer and an encapsulation layer on the substrate, the encapsulation layer surrounds the plurality of memory pillars;

removing the oxide layer from areas of the memory structure located between the plurality of memory pillars, above the encapsulation layer and below the first dielectric layer, wherein after removing the oxide layer a gap remains within the areas of the memory structure; and forming a second dielectric layer directly above the capping layer, wherein the second dielectric layer pinches off the opening to form airgaps.

2. The method of claim 1, wherein the encapsulation layer protects the plurality of memory pillars and comprises a material having a dielectric constant lower than that of silicon nitride, and resistant to hydrofluoric acid.

3. The method of claim 2, wherein the material comprises siliconborocarbonitride, silicon carbon nitride, or silicon oxycarbonitride.

4. The method of claim 1, further comprising:
adjusting a thickness of the encapsulation layer according to a desired size of the airgaps.

5. The method of claim 1, wherein the oxide layer comprises silicon dioxide, a flowable oxide, or spin-on material.

6. The method of claim 1, further comprising:
forming a hard mask on top of the plurality of memory pillars.

7. A method of forming a memory structure, the method comprising:
forming an encapsulation layer above and in direct contact with a plurality of memory pillars disposed on a substrate;
forming an oxide layer directly above the encapsulation layer;
removing portions of the encapsulation layer located above a top surface of each memory pillar in the plurality of memory pillars;
recessing the oxide layer to expose an uppermost portion of each memory pillar in the plurality of memory pillars;
depositing a first dielectric layer directly above the oxide layer, and in direct contact with the encapsulation layer and the exposed uppermost portion of each memory pillar in the plurality of memory pillars;
forming top metal contacts on the exposed uppermost portion of each memory pillar in the plurality of memory pillars;
depositing a capping layer directly above the first dielectric layer and the top metal contacts;
forming an opening on opposing sides of the plurality of memory pillars, wherein the opening extends through the capping layer, the first dielectric layer and a top portion of the oxide layer;
removing the oxide layer from areas of the memory structure located between the memory pillars, above the encapsulation layer and below the first dielectric layer, wherein after removing the oxide layer a gap remains within the areas of the memory structure; and
forming a second dielectric layer above the capping layer, wherein the second dielectric layer pinches off the opening to form airgaps.

8. The method of claim 7, wherein recessing the oxide layer to expose the uppermost portion of each memory pillar further comprises:
exposing a plurality of voids within the oxide layer.

9. The method of claim 8, further comprising:
depositing an oxide material to fill the plurality of voids within the oxide layer.

10. The method of claim 7, wherein the encapsulation layer protects the plurality of memory pillars and comprises a material having a dielectric constant lower than that of silicon nitride, and is resistant to hydrofluoric acid.

11. The method of claim 10, wherein the material comprises siliconborocarbonitride, silicon carbon nitride, or silicon oxycarbonitride.

12. The method of claim 7, further comprising:
adjusting a thickness of the encapsulation layer according to a desired size of the airgaps.

13. The method of claim 7, wherein the oxide layer comprises silicon dioxide, a flowable oxide, or spin-on material.

14. The method of claim 7, further comprising:
forming a hard mask on top of the plurality of memory pillars.

* * * * *